United States Patent [19]

Perkins

[11] Patent Number: 4,991,188
[45] Date of Patent: Feb. 5, 1991

[54] DIGITAL FREQUENCY DIVIDER

[75] Inventor: Luke A. Perkins, Colorado Springs, Colo.

[73] Assignee: NCR Corporation, Dayton, Ohio

[21] Appl. No.: 282,547

[22] Filed: Dec. 12, 1988

[51] Int. Cl.$^5$ .............................................. H03K 23/48
[52] U.S. Cl. ....................................... 377/49; 377/48; 364/703
[58] Field of Search .................. 364/703, 764; 377/48, 377/49

[56] References Cited

U.S. PATENT DOCUMENTS

| | | | |
|---|---|---|---|
| 3,657,658 | 4/1972 | Kubo | 377/110 |
| 3,976,946 | 8/1976 | Schroder | 377/48 |
| 4,031,476 | 6/1977 | Goldberg | 377/48 |
| 4,318,046 | 3/1982 | Sonntag | 377/48 |
| 4,374,427 | 2/1983 | Katayama | 364/764 |

FOREIGN PATENT DOCUMENTS 51-11500  8/1978  Japan .................................. 364/764

OTHER PUBLICATIONS

IBM-Tech Bul. vol. 24, No. 8, Jan. 1982, "Fractional Frequency Division Clock Circuit", by Miller et al., pp. 4103–4104.

Primary Examiner—John S. Heyman
Attorney, Agent, or Firm—Wilbert Hawk, Jr.

[57] ABSTRACT

A digital frequency divider capable of providing output pulses of frequency $f_{out}$ related by Y/X to the frequency of the input pulses $f_{in}$, where X and Y are positive whole numbers and $0 < Y/X \leq 1$. The circuit is particularly suited for high frequency digital applications. The X and Y values may be fixed or individually variable. Truncation errors decrease with time to provide a best estimate output frequency. In a preferred arrangement, iterative summations of residual and incremental values are latched and recycled as feedback in synchronism with the rate of the input frequency.

12 Claims, 1 Drawing Sheet

4,991,188

DIGITAL FREQUENCY DIVIDER

BACKGROUND OF THE INVENTION

The present invention relates to digital electronic circuits, and more particularly to circuits which are capable of dividing a digital format frequency by a rational number.

A classic problem in digital circuit design has been the development of circuits which divide a succession of digital pulses of defined repetition rate or frequency by a rational number. The prevailing solutions use counters having various feedback and feedforward loops. Examples of such preexisting implementations appear in U.S. Pat. Nos. 4,295,158; 4,318,046; and 4,704,723. The first two of the noted references require hardware reconfiguration to change the divisor, while the latter provides greater latitude at the expense of increasing the number of counters, comparators, switches and registers necessary to implement even a meager division of the input frequency. Consequently, the prevailing approaches of the prior art are characteristically inflexible as to the divisor or inordinately complex as to implementation.

Digital circuits are continually being pressed for higher operating frequencies. In such context, frequency dividers that are implemented with counters consistently suffer from the ripple delays associated with multiple flip-flop stages and logic gates. Therefore, logic devices of limited complexity and elevated speed capability are clearly preferred for advanced high speed digital signal processing applications.

In applications where the divisor can be a ratio of any prime numbers greater than one, it is paritcularly important that the circuit provide on a continuous basis a accurate divided frequency in which truncations do not accumulate or become material sources of error. Therefore, a preferred circuit would provide on continuous basis the best estimate of the output frequency without truncation.

Algorithms suitable to compute the coordinates of pixels in two dimensional raster grid patterns where the end points are defined have been the subject of numerous investigations. Of particular interest is the Bresenham Line Algorithm, in that the algorithm utilizes integer arithmetic to define the pixel positions of a line in a raster grid based upon the X and Y coordinates of a starting point and an end point. The Bresenham Line Algorithm is developed and illustrated by example in the text authored by Foley et al., entitled *Fundamentals of Interactive Computer Graphics*, copyright 1982 by Addison-Wesley Publishing Co., as appears on pages 433–436.

SUMMARY OF THE INVENTION

The present invention utilizes some iterative concepts from the Bresenham Line Algorithm to configure a digital frequency divider which provides a best estimate output frequency corresponding to a rational number fraction of the input frequency, wherein $f_{out} = Y/X\, f_{in}$ and $0 < Y/X < 1$. The implementation is further refined to minimize complexity and optimize resolution. In this regard, the preferred embodiment exchanges initial condition precision for long term resolution by eliminating a multiplication factor and shifting the associated bit position to a different relative position.

A preferred implementation of the frequency divider includes as a first group multiple registers, a multiplexer and an adder suitable to provide an output of value Y or Y−X depending on the sign of an iterative output. One or the other of such values are successively summed in a primary adder with a feedback value corresponding to the immediately preceding interatively calculated sum. The output of the primary adder is latched in synchronism with input frequency pulses and fed back into the primary adder for the successive interactive operation. Each time the output value changes sign, a multiplexer is enabled to pass an input frequency pulse to the output, wherein the pulse frequencies are related by $f_{out} = Y/X\, f_{in}$.

The frequency divider of the present invention provides over an extended term a best estimate of the fractional output frequency. Resolution of the output frequency is further improved within the defined bit count of the binary numbers X and Y.

These and other features of the invention will be more clearly understood and appreciated upon considering the detailed embodiment described hereinafter.

DESCRIPTION OF THE PREFERRED EMBODIMENT

Figure 1:
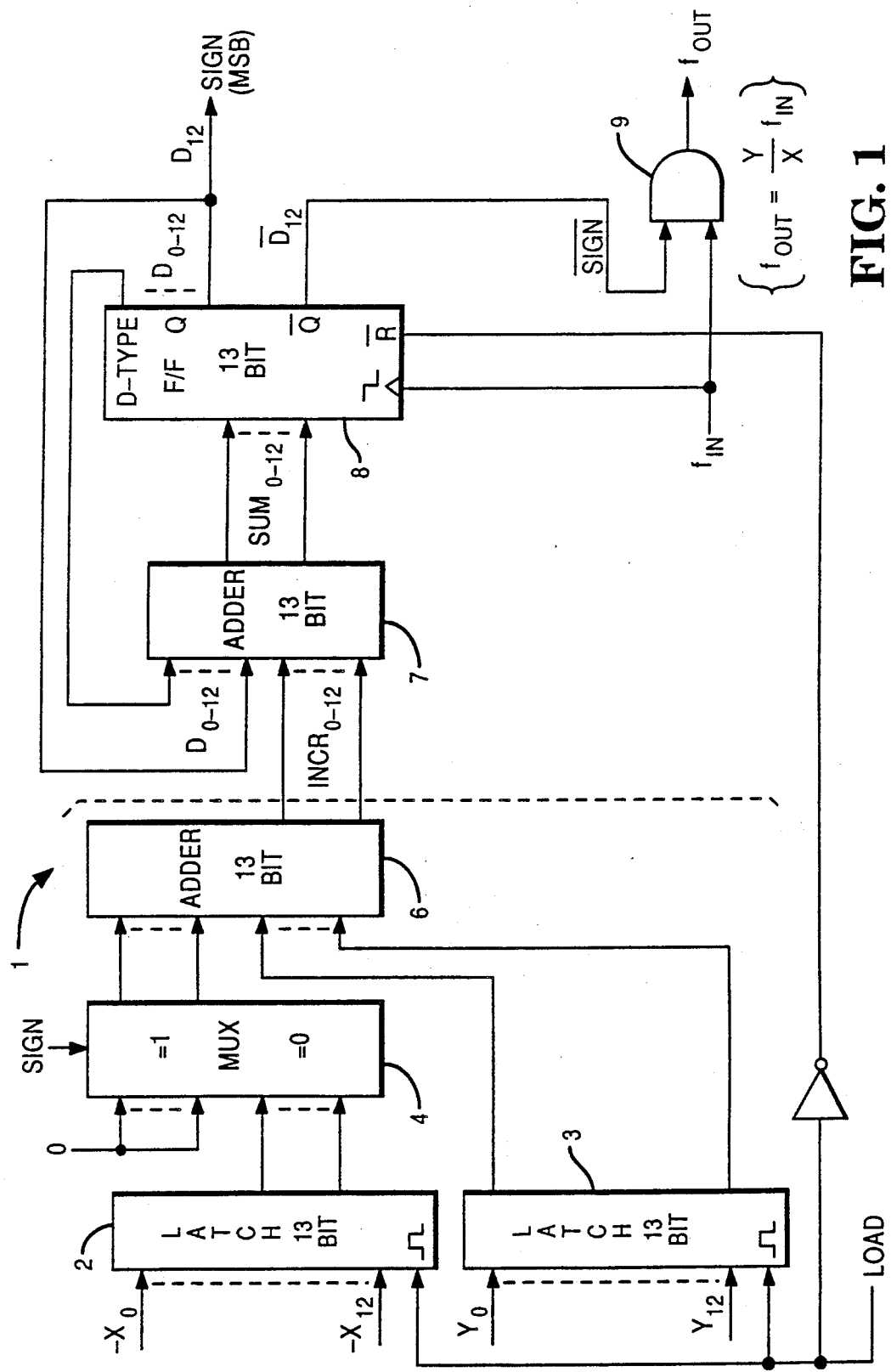
FIG. 1, the sole drawing FIGURE, schematically illustrates by functional block diagram an embodying frequency divider.

FIG. 1 illustrates a solution to a particularly acute and relatively classic problem in digital signal processing applications, whereby the objective is to provide a train of digital pulses having an output frequency $f_{out}$ which is a relatively precise fraction of the input pulse frequency $f_{in}$. In prescribing the fractional relationship, the output to input ratio of the frequencies is defined to be Y/X, where $0 < Y/X \leq 1$ and both X and Y are positive whole numbers. Relative truncation errors decrease with the number of cycles. The output becomes valid after X input pulses, where X is the fractinon denominator and is no less than $2^{(n-1)} - 1$, for n bit data words.

Bresenham's Line Algorithm describes an iterative operation for selecting graphic display pixels of discrete integer positions in drawing a line of slope Y/X in an X—Y plane video display. The algorithm involves incrementation along the X axis and grid based relational decisions in selecting the Y axis value. The decision of whether the Y value should be incremented is determined by a multiple of the Y increment less the X increment. Particulars of the algorithm are set forth in the above identified text.

The present invention draws upon some concepts in the Bresenham Line Algorithm and following refinement develops a structural arrangement for directly dividing digital frequency signals. The X and Y numbers are entered as binary value data during a load operation, which load operation concurrently resets the circuit. Thereafter, the falling edges of the $f_{in}$ pulses initiate iterative operations using two feedback loops to mathematically determine a best estimate of when successive input pulse $f_{in}$ should be conveyed as an output pulse $f_{out}$ to meet the required relationship that $f_{out} = Y/X\, f_{in}$. The circuit as implemented, provides an exceptionally broad range of frequency ratios given that X and Y are constrained only to be positive whole numbers with values of $X \geq Y$. Consequently, the output frequency can range from a maximum of the input frequency to a minuscule fraction thereof, defined by the ratio of Y/X, and becomes valid after X input pulses.

A structural implementation of an embodying frequency divider, generally identified as 1, is shown in the drawing. As depicted, it includes latches 2 and 3 for receiving and holding binary data representing the values of X and Y in binary format. The X value entered into latch 2 is provided in a 2's complement negative format. The X value is multiplexed in block 4 with a 0 value before being provided to adder 6. The multiplexer transmits the $-X$ value to adder 6 when the value SIGN is 0, but transmits a value of 0 to adder 6 whenever the SIGN feedback signal has a value of 1. Adder 6 provides as an output a sum identified as INCR having a value of either Y or Y—X for respective SIGN signal values of 1 and 0.

The INCR values, Y or Y—X, are further summed in adder block 7 with a number representing the result of the immediately preceding iteration. The addition of such feedback value D with the value INCR in adder 7 produces a 13-bit binary output, identified as SUM, suitable for latching into D-type flip-flop 8. The latching of the value SUM into flip-flop 8 is initiated in synchronism with the falling edge of the $f_{in}$ pulse. Consequently, flip-flop 8 latches the present value of SUM and provides thereafter feedback data D to adder 7 for subsequent iterative summing. The most significant bit (MSB) of flip-flop 8 represents the state of the SIGN feedback signal used to drive multiplexer 4. The complement of SIGN is used to drive AND gate in prescribing when an $f_{in}$ pulse is to be transmitted as an $f_{out}$ pulse.

The conceptual objective of the circuit is to provide an $f_{out}$ pulse for every Y/X $f_{in}$ pulses received by the circuit. The circuit implemented in the drawing accomplishes this objective by first defining an increment Y—X, where X is known to be equal to or larger than Y. Thereby, the SUM value entered into flip-flop 8 with the falling edge of the first pulse following the load sequence is negative in magnitude, given that the INCR output of adder 6 is Y—X and D is zero in value. For such 2's complement negative value the most significant bit of the D output from the flip-flop 8 will become 1 in value. Consequently, following the conclusion of the first $f_{in}$ pulse adder 6 is receiving a 0 value from multiplexer 4 as one input and Y as the other input, to generate for SIGN=1 an output value INCR=Y. Adder 7 receives as inputs such value Y and the feedback signal D from flip-flop 8. The D output of flip-flop 8 is the previously entered value Y—X, where X is larger than Y. he output from adder 7 at the conclusion of the first $f_{in}$ pulse is a number identified as SUM and with a value of $2Y-X$. Upon the falling edge of the second $f_{in}$ pulse the new SUM=$2Y-X$ value is latched into flip-flop 8 and fed back for subsequent iterative operations to adder 7.

Repetition of such iterative operations with successive $f_{in}$ pulses eventually leads to a SUM value from adder 7 which is no longer negative in value. When the value of SUM becomes positive and is latched into flip-flop 8 in synchronism with the falling edge of the $f_{in}$ pulse, the SIGN bit of output D changes to 0 and SIGN/ becomes 1 in value. A SIGN/ value of 1 enables AND gate 9 to pass the next successive $f_{in}$ pulse to the $f_{out}$ line.

Flip-flop 8 can be operated in synchronism with the rising edge of the $f_{in}$ pulses if the $f_{in}$ pulse conveyed to AND gate 9 is delayed sufficiently to allow stabilization of the newly latched SIGN/state latched into flip-flop 8. Otherwise, the temporary time overlap of the previous SIGN/ with the $f_{in}$ pulse is likely to generate a very brief but erroneous $f_{out}$ pulse.

It should be noted that the value of SUM is retained in flip-flop 8 as a remainder and fed back to adder 7 for subsequent addition to the INCR value. With SIGN of value 0, INCR is again Y—X in value. The retention in flip-flop 8 and use in adder 7 of such remainder value eliminates truncation errors and provides a continuously improving best estimate of the output frequency calculated in accordance with the ratio of Y/X $f_{in}$.

The LOAD command used to latch the X and Y values is also used to reset flip-flop 8. This arrangement has two implications. First, the output frequency is based upon the slope Y/X without respect to initial conditions. Second, in the absence of initial conditions and with the use of a 2's complement X value, the least significant bit for SUM remains at 0. Consequently, under such conditions, the least significant bit for the SUM and D lines can be omitted to reduce the size of adder 7 and flip-flop 8, or shifted to obtain greater resolution with the same size adder and flip-flop. An embodiment which accepts initial conditions into flip-flop 8 as part of the load cycle can be configured with relatively minor circuit revisions.

One of skill in the technology will no doubt appreciate that the contributions of latch 2, latch 3, multiplexer 4 and adder 6 can be provided by other means, and are likely to be so furnished if the values X and Y are fixed in magnitude. In such applications value, the values on line INCR cycle between Y and Y—X depending on the state of the SIGN signal. Consequently, the drawing illustrates a preferred arrangement in which the values of X and Y are expected to be varied at the discretion of the user. The blocks to the left of the dashed line in the drawing are thus desirable but not central to the operative capability of the invention. Irrespective of whether a fixed or variable frequency division configuration is implemented, the synchronization, feedback, and iterative summation practices would remain intact.

AND gate logic block 9 extends the operating range of the frequency divider to a unity relationship between $f_{in}$ and $f_{out}$. The presence of AND gate 9 ensures that $f_{out}$ signals are provided when $\frac{1}{2}X < Y \leq X$ is propagated through the divider, a situation which produces a SIGN/ signal fixed in a high state.

The circuit as embodied in the drawing is particularly suited to very high frequency digital applications where only limited reference frequencies are available and a broad range of output frequencies are desired. As to changes, INCR is either Y or Y—X in value. Though adder 7 and flip-flop 9 must be capable of operating at the input or base frequency $f_{in}$, such functional elements are readily available with extended frequency capability. Even with the extended capability of handling variable X and Y values, the additional elements, namely adder 6 and multiplexer 4, are devices readily available with high speed capability. Thereby, circuit 1 not only provides digital frequency division with best estimate outputs, but accomplishes this with decreasing relative truncation error, a full range of frequencies extending at the upper range to the base or input frequency $f_{in}$, and a structural configuration which facilitates exceptionally high frequency operation.

It will be understood by those skilled in the art that the embodiments set forth hereinbefore are merely exemplary of the numerous arrangements by which the invention may be practiced, and as such may be replaced by equivalents without departing from the invention which will now be defined by appended claims.

I claim:

1. A digital frequency divider for receiving pulses at an input frequency $f_{in}$ and providing pulses at an output frequency $f_{out}$, where $f_{out} = Y/X\, f_{in}$, comprising:
   first means for providing, as a first means output, the numerical value of Y or the difference between Y and X;
   second means for deriving the difference between the first means output and a stored number;
   third means coupled to said first means, for providing the numerical value of X;
   means for successively storing the difference derived by the second means and providing that difference as a stored number to the second means during a subsequent derivation of a difference in the second means, operable at a rate derived from $f_{in}$; and
   means for generating $f_{out}$ pluses depending upon the relative value of the stored number;
   wherein the first means output depends on the value of the difference derived by the second means, X and Y are positive whole numbers, and the ratio of Y/X is defined by $0 < Y/X < 1$.

2. The apparatus recited in claim 1, wherein:
   X and Y are binary form numerical values; and
   the second means is a binary adder.

3. The apparatus recited in claim 2, wherein the means for successively storing is a clocked numerical value latching device.

4. The apparatus recited in claim 3, wherein X and Y are positive whole numbers and are related by $0 < Y/X \leq 1$.

5. The apparatus recited in claim 4, wherein the first means output is either Y or Y—X in value.

6. A digital frequency divider for receiving pulses at an input frequency $f_{in}$ and providing pulses at an output frequency $f_{out}$, where $f_{out} = Y/X\, f_{in}$, comprising:
   first means for providing, as a first means output, the numerical value of Y or the difference between Y and X, said first means comprising a multiplexer receiving X and providing an output of X or 0, a first binary adder receiving the output of a multiplexer and Y, which first binary adder provides said first means output, and a means for selectively controlling the state of the multiplexer;
   second binary adder for deriving the difference between the first means output and a stored number;
   third means coupled to said first means, for providing the numerical value of X;
   clocked numerical value latching device for successively storing the difference derived by the second binary adder and providing that difference as a stored number to the second adder during a subsequent derivation of a difference in the second adder, operable at a rate derived from $f_{in}$; and
   means coupled to said clocked numerical value latching device, for generating $f_{out}$ pulses depending upon the relative value of the stored number;
   wherein the means for selectively controlling the state of the multiplexer depends on the value of the difference derived by the second adder, X and Y are binary form positive whole numbers, and the ratio of Y/X is defined by $0 < Y/X \leq 1$.

7. The apparatus recited in claim 6, wherein:
   the X value is provided as a 2's complement negative value; and
   the Y value is provided as a positive value.

8. The apparatus recited in claim 7, wherein the means for selectively controlling is a signal representing the sign of the stored number.

9. The apparatus recited in claim 8, wherein the means for generating $f_{out}$ pulses is a gate which blocks or passes $f_{in}$ pulses depending upon the sign of the stored number.

10. The apparatus recited in claim 9, wherein the clocked numerical value latching device is a D-type flip-flop or register synchronized to $f_{in}$.

11. A digital frequency divider for receiving pulses at an input frequency of $f_{in}$ and providing pulses at an output frequency of $f_{out}$, where $f_{out} = Y/X\, f_{in}$ with X and Y being positive whole numbers and $0 < Y/X \leq 1$, comprising:
   a first adder connected to provided a binary output of the value Y or Y—X;
   means coupled to the first adder, for providing a numerical value of X;
   a second adder connected to add the output from the first adder to a second binary input;
   a binary value latching register connected to latch the binary value from the second adder in synchronronism with a first $f_{in}$ pulse and provide a binary value as a second binary input to the second adder in synchronism with the next $f_{in}$ pulse; and
   a logic gate for receiving $f_{in}$ pulses and generating $f_{out}$ pulses depending upon the signal of the latched binary value from the second adder;
   wherein the binary output of the first adder depends on the binary value provided by the binary value latching register.

12. The apparatus recited in claim 11, wherein the binary value latching register is synchronized to the falling edge of the $f_{in}$ pulse.

* * * * *